(12) United States Patent
Xiong et al.

(10) Patent No.: US 9,006,562 B2
(45) Date of Patent: Apr. 14, 2015

(54) HIGH-CONCENTRATION SOLAR CELL CHIP

(76) Inventors: Weiping Xiong, Fujian (CN); Guijiang Lin, Fujian (CN); Minghui Song, Fujian (CN); Zhimin Wu, Fujian (CN); Zhaoxuan Liang, Fujian (CN); Zhidong Lin, Fujian (CN)

( * ) Notice: Subject to any disclaimer, the term of this patent is extended or adjusted under 35 U.S.C. 154(b) by 0 days.

(21) Appl. No.: 14/124,566

(22) PCT Filed: May 7, 2012

(86) PCT No.: PCT/CN2012/075135
§ 371 (c)(1),
(2), (4) Date: Dec. 6, 2013

(87) PCT Pub. No.: WO2013/000339
PCT Pub. Date: Jan. 3, 2013

(65) Prior Publication Data
US 2014/0102534 A1    Apr. 17, 2014

(30) Foreign Application Priority Data
Jun. 28, 2011 (CN) ............. 2011 1 0176319

(51) Int. Cl.
*H01L 31/0224* (2006.01)
(52) U.S. Cl.
CPC ......... *H01L 31/022433* (2013.01); *Y02E 10/50* (2013.01)
(58) Field of Classification Search
CPC .............................. H01L 31/022433
USPC ......................... 136/256, 255, 252
See application file for complete search history.

(56) References Cited

U.S. PATENT DOCUMENTS

| 4,227,942 | A | * | 10/1980 | Hall | 136/255 |
| 4,886,555 | A | * | 12/1989 | Hackstein et al. | 136/255 |
| 4,963,195 | A | * | 10/1990 | Kodato et al. | 136/225 |
| 5,704,992 | A | * | 1/1998 | Willeke et al. | 136/255 |
| 7,288,426 | B2 | * | 10/2007 | Geyer | 438/63 |

(Continued)

FOREIGN PATENT DOCUMENTS

| CN | 102222706 A | 10/2011 |
| JP | 2000-208804 A | 7/2000 |
| JP | 2010-50213 A | 3/2010 |

OTHER PUBLICATIONS

PCT/CN2012/075135 International Search Report, dated Aug. 2, 2012, 2 pages.

*Primary Examiner* — Golam Mowla
(74) *Attorney, Agent, or Firm* — Patent Law Group LLP; Brian D. Ogonowsky (57) ABSTRACT

A high-concentration solar cell includes an epitaxial layer structure, an upper patterned electrode on the top surface, and a back electrode on the back surface. The upper patterned electrode includes a primary pattern and a secondary pattern, where the primary pattern is composed of a series of small metal isosceles trapezoids around the perimeter of the cell. The narrower base of each metal trapezoid points toward an interior of the cell. A lead soldering pad is located within each metal trapezoid for being soldered to an external conductor for carrying the solar cell current. The secondary pattern consists of thin spaced conductors that connect to the angled sides and base of each trapezoid and spread current across the top surface of the cell. The current along the angled sides of each trapezoid is well-distributed to all the spaced conductors connected to the angled sides to avoid current crowding.

15 Claims, 5 Drawing Sheets

(56) References Cited

U.S. PATENT DOCUMENTS

| | | | |
|---|---|---|---|
| 8,415,554 B2 * | 4/2013 | Das | 136/246 |
| 2010/0201349 A1 | 8/2010 | Trira et al. | |
| 2011/0297220 A1 * | 12/2011 | Rinko | 136/256 |
| 2012/0247554 A1 * | 10/2012 | Wootton | 136/256 |
| 2012/0285519 A1 * | 11/2012 | Hoffman et al. | 136/255 |
| 2013/0284260 A1 * | 10/2013 | Naito et al. | 136/256 |

* cited by examiner

HIGH-CONCENTRATION SOLAR CELL CHIP

CROSS-REFERENCE TO RELATED APPLICATIONS

This application claims priority to PCT Application CN2012/075135, filed on May 7, 2012 and published on Jan. 3, 2013 as publication WO2013000339 A1, which claims priority to Chinese Patent Application No. 201110176319.6 titled "A High-Concentration Solar Cell Chip", and filed with the Chinese Patent Office on Jun. 28, 2011, which is hereby incorporated by reference in its entirety.

FIELD OF THE INVENTION

The present invention relates to a high-concentration solar cell chip.

BACKGROUND OF THE INVENTION

Presently, solar cells for concentrated photovoltaics normally use a gallium arsenide (GaAs)-based multi-junction solar cell. Its concentration factor can be as large as 500×, or even in the scale of thousands, due to the advancement of material performance and processing technology. Moreover, its chip size is much smaller than traditional silicon-based cells, greatly reducing the semiconductor material consumption and making it the most promising solar cell. However, the photocurrent generated by solar cell chip will be in direct proportion to the concentration ratios. For example, by a thousand of concentration factors, three-junction concentrated solar cell will produce a high-density current at 15-20 A/cm2, which requires that the series resistance should be small enough, and also the current distribution should be well-distributed, in order to decrease the resistive loss of the cell and avoid the local overheating caused by current crowding which seriously affects the cell's reliability. If the sunlight distributes uniformly on chip's surface, the current will also be evenly distributed in the chip epitaxial structure and back electrode, but the current crowding problems with the upper electrode, especially the primary grid, would not be changed due to the sunlight distribution.

As for the upper-electrode in the traditional grid, the primary grid has an elongated and regular rectangular structure and a secondary grid evenly connects with the long edge of the rectangle. Considering the current flowing from the secondary grid to the primary grid, it must flow to the lead soldering region through the primary grid. From the view point of resistance, there are two extreme paths for the current flowing through the primary grid: 1) after an outflow from the secondary grid, directly flowing to the lead soldering region along one side of the primary grid closing to the secondary grid; and 2) after an outflow from the secondary grid, vertically flowing to the other side of primary grid which is farther away from secondary grid, and then, to the lead soldering region. Obviously, the current flows along the first shorter path. Thus, all currents flowing from the secondary grid will flow along one side of the primary grid closer to the secondary grid, while the density of current flowing along the other side which is farther away from secondary grid is smaller. The uneven distribution of currents will cause current crowding, and under high-concentrated conditions, this effect will be more severe, which will lead to greater local overheating.

Figure 1:
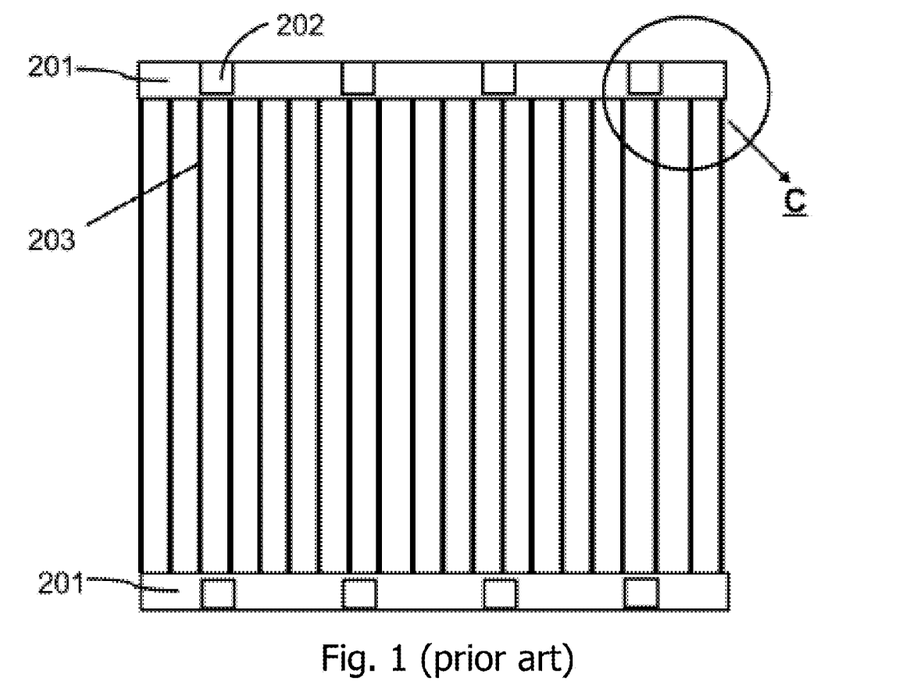
FIG. 1 is a plan view of the upper-electrode in the traditional grid.
Figure 2:
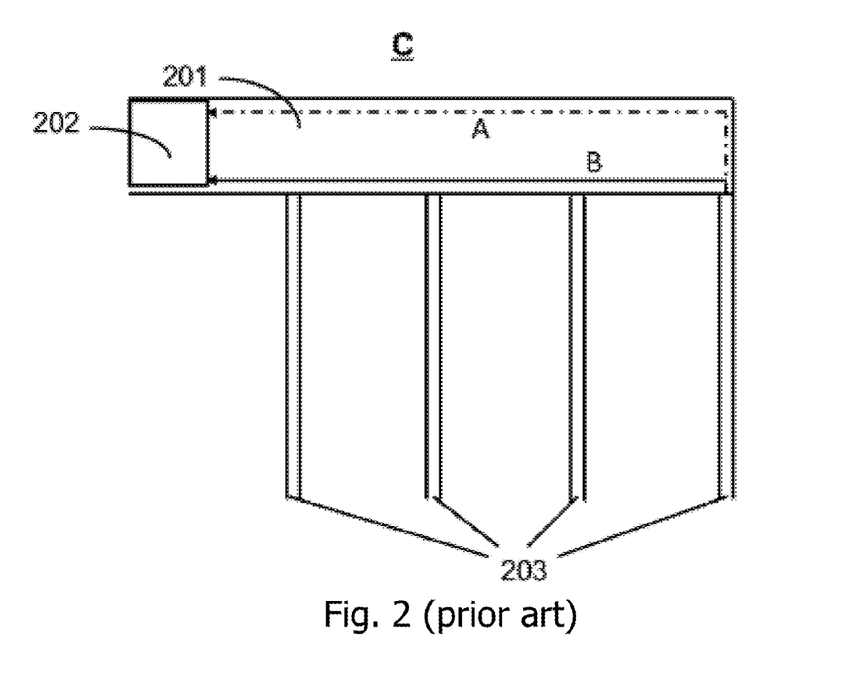
FIG. 2 is a partial enlarged drawing of the upper-electrode in the grid shown in FIG. 1.
Figure 3:
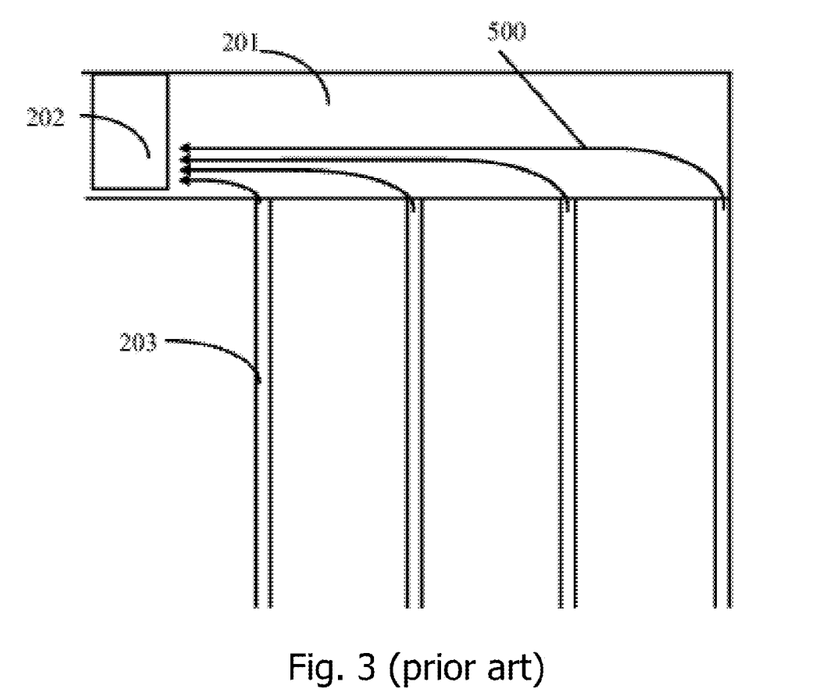
FIG. 3 is an electric flow path diagram of the traditional upper patterned electrode shown in FIG. 1.

FIG. 1 to FIG. 3 are schematic diagrams of the traditional electrode pattern and its current route. A and B (FIG. 2) are respectively the most distant and shortest extreme paths for the current from the secondary grid to flow through the primary grid to the lead soldering region. Obviously, the current tends to flow along the shorter path B. All currents flowing from the secondary grid will flow along one side of the primary grid closer to the secondary grid, which results in the current crowding under high-density current conditions; in comparison, the other side of the primary grid which is farther away from the secondary grid will have a smaller current density of, and thus will make a smaller contribution to the photocurrent transmission and in essence sacrifice the effective illumination area on the cell's surface.

SUMMARY OF THE INVENTION

In order to solve the problem above, the present invention provides a high-concentration solar cell chip, the structure of which includes: an epitaxial layer structure, an upper patterned electrode on the upper surface of the epitaxial layer structure, and a back electrode on the lower surface of the epitaxial layer structure. The upper patterned electrode contains the primary grid and the secondary grid. The primary grid is composed of a series of isosceles trapezoid structures. Trapezoidal upper-bases are in the same line pointing to the interior of cell chip. The region from the upper-base of trapezoids to the lower-base is the lead soldering region. The secondary grid connects the two sides or the upper-bases of the isosceles trapezoids of the primary grid.

Preferably, the number of isosceles trapezoids of the primary grid is equal to that of soldering wires on the primary grid. The region from the upper-base of the trapezoids to the lower-base is the lead soldering region. The length of the upper-base is equal to the width of the lead soldering region, which is perpendicular to the secondary grid. The length of the lower-base is equal to the spacing between the adjacent lead soldering regions.

Preferably, the spacing between the secondary grids is equal, and the secondary grids evenly connect the two sides or the upper-base of isosceles trapezoid of the primary grid.

Preferably, the isosceles trapezoids of the primary grid are arranged sequentially, with the trapezoidal lower-bases on the same line, and all the isosceles trapezoidal upper-bases, which point to the interior of the cell, on the same line.

Preferably, the primary grid is divided into two columns located on two opposing sides of the solar cell, and the upper-bases of the said isosceles trapezoids point to the interior of the cell.

Preferably, the primary grid is divided into four columns located on all four sides of the solar cell, and the upper-bases of the isosceles trapezoids point to the interior of the cell.

Preferably, as for the isosceles trapezoids of the primary grid, the length of its upper-base is 0.1~2 mm, the length of its lower-base is 2~5 mm, and the height of the isosceles trapezoids is 0.1~1 mm.

Preferably, the upper patterned electrode includes: an ohmic contact layer covering the epitaxial layer structure; an adhesion layer covering the ohmic contact layer; a conductive layer covering the adhesion layer; and a protective layer covering the conductive layer.

Preferably, the upper patterned electrode and the bare surface of epitaxial layer are both covered with an anti-reflective coating.

Compared with the prior art, the present invention has advantages as follows:

First, the upper patterned electrode as designed can effectively prevent the problem of current crowding. Due to the connection points between the secondary grid and the primary grid being evenly distributed to two sides of the upper-base of the isosceles trapezoid, namely evenly distributed along the vertical direction of primary grid, and the principle that current flow follows the shortest path, the current flowing from the secondary grid to the primary grid will respectively flow along the shortest line to the lead soldering region, so as to realize the well-distributed spreading of current and avoid the problem of current crowding.

Second, the invention adds more effective illumination area on the cell's surface without the increase of resistive loss and current crowding, and thereby, improves the photocurrent size and the photoelectric conversion efficiency.

Furthermore, the invention also includes an optimized design for the upper patterned electrode with the four-layer structure in order to ensure good ohmic contact to the solar cell epitaxial layer and also ensure good conductivity of the electrode. The adhesion layer promotes adhesion between the conductive layer and the ohmic contact layer and prevents any inter-diffusion between them from. The protective layer protects the conductive layer from oxidation and contamination, and in addition, it allows for wider selection of suitable materials for soldering on the electric lead.

BRIEF DESCRIPTION OF THE DRAWINGS

The present invention is further described in details and not limited hereafter in conjunction with the accompanying drawings and the preferred embodiments. In addition, the drawings are descriptive and not drawn to scale.

Elements that are the same or similar are labeled with the same numeral.

Components in the drawings include:
100: Antireflection film
200: Upper patterned electrode
201: Primary grid
202: Lead soldering region
203: Secondary grid
204: Ohmic contact layer
205: Adhesion layer
206: Conductive layer
207: Protective Layer
300: Epitaxial layer structure
400: Back electrode
500: Electric flow path

DETAILED DESCRIPTION

An embodiment of present invention is further described in detail hereafter in conjunction with the accompanying drawings. The embodiment of the present invention and each feature of embodiment under non-conflicting situations can be combined with each other, which is within the protection scope of the invention.

Figure 4:
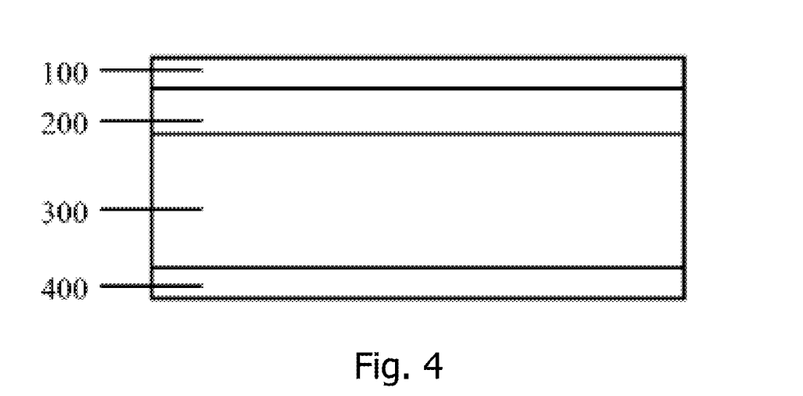
FIG. 4 is a cross-sectional view of a high-concentrated solar cell chip according to a preferred embodiment of the invention.

As shown in FIG. 4, a high-concentration solar cell chip includes an epitaxial layer structure 300 specifically designed for a high-concentration solar cell, which is of a III-V compound and can be a either single-junction or multi-junction structure; an upper patterned electrode 200 formed on the upper surface of the epitaxial layer structure 300; and a back electrode 400 formed on the lower surface of epitaxial layer structure 300. In a preferred embodiment of the invention, the upper patterned electrode 200 and the exposed surface of epitaxial layer 300 are both covered with an antireflection film 100.

Figure 5:
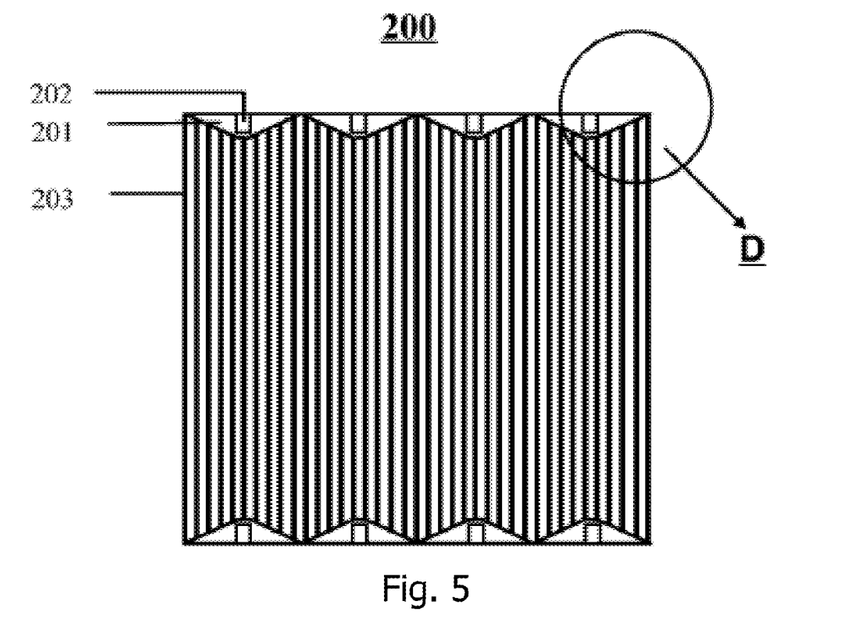
FIG. 5 is a plan view of the upper patterned electrode according to the first preferred embodiment of the invention.
Figure 6:
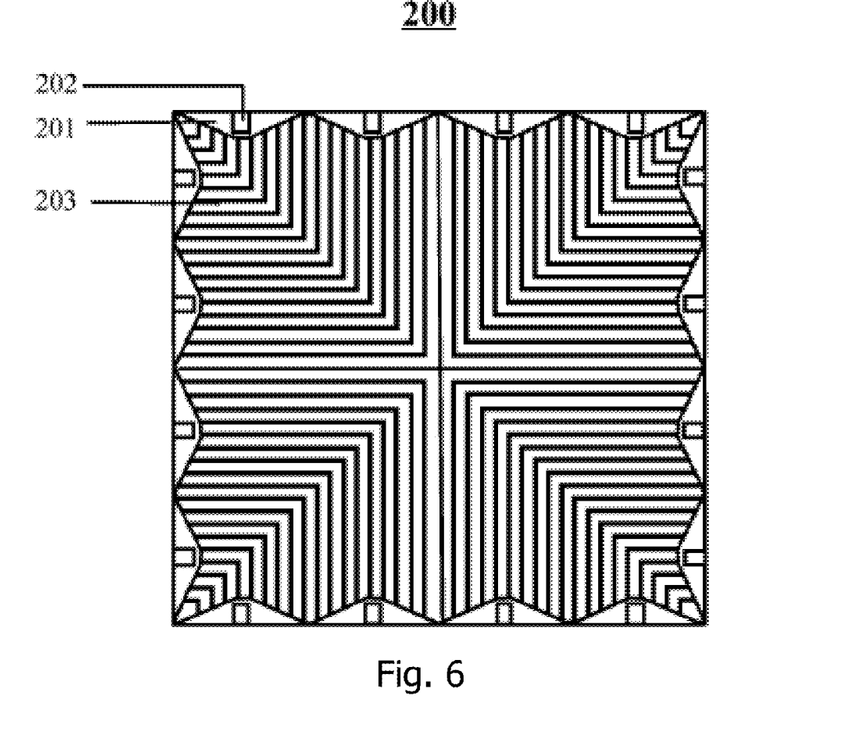
FIG. 6 is a plan view of the upper patterned electrode according to another preferred embodiment of the invention.
Figure 7:
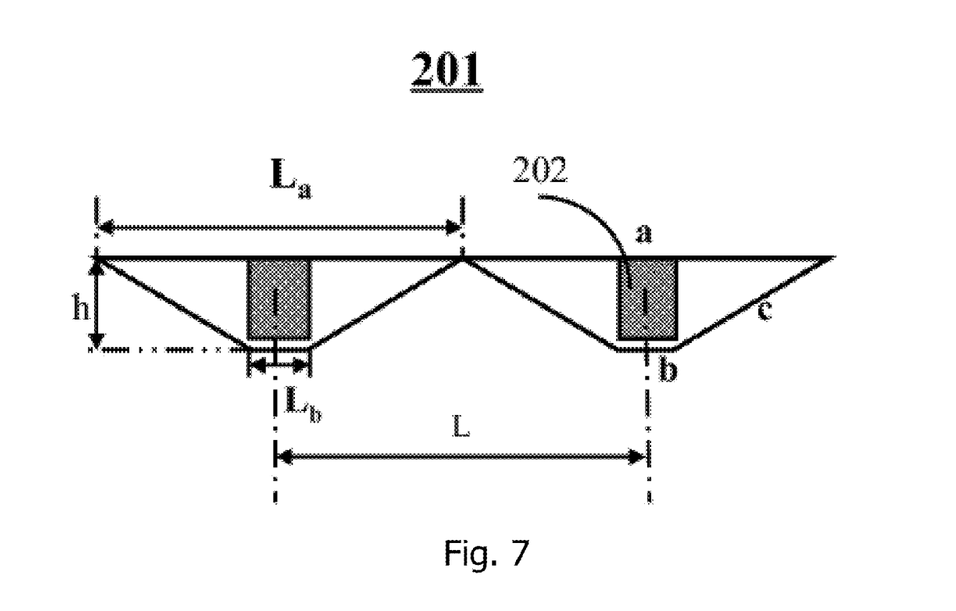
FIG. 7 is a partial enlarged drawing of the structure of primary grid in upper patterned electrode shown in FIG. 5.

As shown in FIG. 5 to FIG. 7, the upper patterned electrode 200 comprises the primary grid 201 and the secondary grid 203; the primary grid 201 is composed of a series of isosceles trapezoid structures, and trapezoidal upper-bases b (FIG. 7) are in the same line and pointing to the interior of cell. The region between the upper-bases of the trapezoids and the lower-bases is the lead soldering region 202 for soldering to an external conductor to carry the solar cell current. The secondary grid 203 has even spacing and connects either the two angled sides of the isosceles trapezoids or the upper-bases of the isosceles trapezoids of the primary grid 201 to the sides and upper bases of other trapezoid in the primary grid 201. According to a preferred embodiment of the invention, the number of isosceles trapezoids of the primary grid 201 is equal to that of soldering wires on the primary grid; the region between the upper-bases of the trapezoids and the lower-bases is the lead soldering region; the length $L_a$ (FIG. 7) of the lower-base a (FIG. 7) is equal to the distance L between the adjacent lead soldering regions. The length $L_b$ of the upper-base b of the trapezoids is decided in terms of the size of the lead soldering region. According to a preferred embodiment of the invention, the length $L_b$ of the upper-base b is equal to the height of the lead soldering region perpendicular to the secondary grid. The length $L_b$ of the upper-base b of the isosceles trapezoid of the primary grid 201 is 0.1~2 mm, the length $L_a$ of the lower-base a is 2~5 mm, and the height h of the isosceles trapezoids is 0.1~1 mm. According to a preferred embodiment of the invention, the length of the upper-base of isosceles trapezoid is 0.5 mm, the length of the lower-base is 2.5 mm, and the height is 0.3 mm.

The primary grid 201 is constructed by a series of trapezoids, which can be configured on either two sides or four sides of the cell. As shown in FIG. 5, when it is constructed in the two-side configuration, two rows of trapezoids are distributed on two sides of the solar cell, and thereof, the upper-base b of isosceles trapezoids points to the interior of the cell. As shown in FIG. 6, when it is constructed in the four-side configuration, four rows of trapezoids are distributed on all four sides of the solar cell, and the upper-base of isosceles trapezoids points to the interior of the cell.

Due to the high current density in the solar cell under high-concentration conditions, there are stringent challenges on the ohmic contact between the electrode and the epitaxial layer, the electric conductivity of electrode, and the secondary electrode design. Therefore, the preferred embodiment of invention has adopted a multilayer electrode structure since a single metal layer cannot meet the application requirements.

Figure 9:
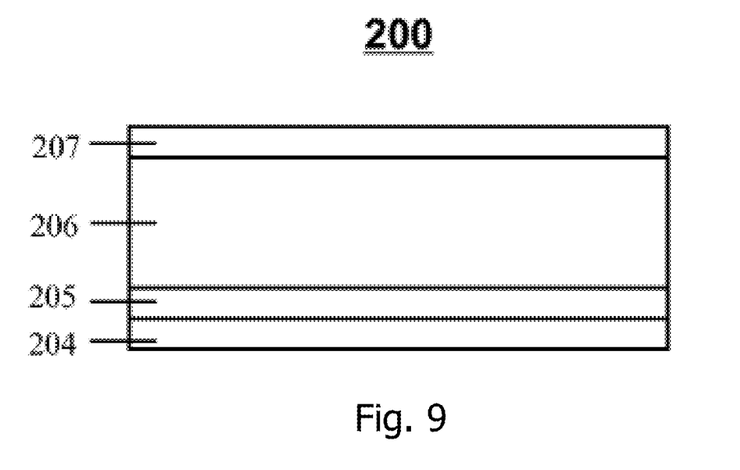
FIG. 9 is a side sectional view of the upper patterned electrode according to a preferred embodiment of the invention.

As shown in FIG. 9, the upper patterned electrode 200 comprises an ohmic contact layer 204, an adhesion layer 205, a conductive layer 206, and a protective layer 207.

The ohmic contact layer 204 covering the epitaxial layer structure 300 is used to form a good ohmic contact with the epitaxial layer structure 300 of the high-concentration solar cell. With a thickness of 10~300 nm, it is made of AuGe alloy, or germanium, or palladium, or any combination thereof. According to a preferred embodiment of the invention, the ohmic contact layer 204 with a thickness of 200 nm is made of Au Ge alloy.

The adhesion layer 205 covering the ohmic contact layer 204 is used to promote adhesion between the ohmic contact layer 204 and conductive layer 206. With a thickness of 1~20 nm, it is made of titanium, or nickel or any combination thereof. According to a preferred embodiment of the invention, the adhesion layer 205 with a thickness of 10 nm is made of titanium.

The conductive layer 206 covering the adhesion layer 205 with a thickness of 1~10 microns is made of high conductivity materials, such as silver, aluminum. According to a preferred embodiment of the invention, the conductive layer 206 with a thickness of 6 nm is made of silver.

The protective layer 207 covering the conductive layer 206 with a thickness of 10~200 nm is used to protect the conductive layer and prevent oxidation and contamination. Suitable materials for the protective layer can be selected while taking into account the requirement for soldering of the electric leads. According to a preferred embodiment of the invention, the protective layer with a thickness of 20 nm is made of gold.

All four layers 204~207 of the upper patterned electrode 200 follow the same pattern of upper patterned electrode 200.

Figure 8:
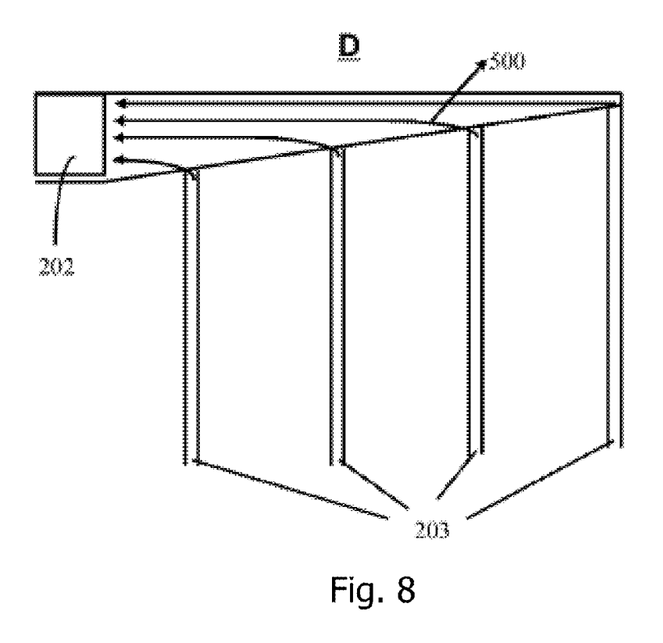
FIG. 8 is an electric flow path diagram of the upper patterned electrode shown in FIG. 5.

FIG. 8 is an electric flow path diagram of the upper patterned electrode according to a preferred embodiment of the invention. Due to the connection points between the secondary grid 203 and the primary grid 201 being evenly distributed on the two sides or the upper-base of isosceles trapezoid, namely evenly along the vertical direction of primary grid, since electric current 500 will flow according to the shortest path principle, the current flowing from the secondary grid 203 to the primary grid 201 will respectively flow along the shortest path to the lead soldering region 202, so as to realize the well-distributed spreading of current 500 and avoid the problem of current crowding.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A solar cell, comprising:
an epitaxial layer structure;
an upper patterned electrode on a top surface of the epitaxial layer structure;
a back electrode on a back surface of the epitaxial layer structure, wherein a current is generated between the upper patterned electrode and the back electrode when the solar cell generates current;
the upper patterned electrode comprising a primary electrode pattern and a secondary electrode pattern, wherein the primary electrode pattern comprises a series of isosceles trapezoidal structures, each isosceles trapezoidal structure having a lower base pointing away from the cell, having a narrower upper base pointing toward an interior of the cell, and having angled sides between edges of the lower base and the upper base;
wherein the upper bases of the trapezoidal structures along a same edge of the cell are in a same line;
a lead soldering region within each trapezoidal structure, each lead soldering region being configured for being electrically connected to an external conductor to conduct current; and
wherein the secondary electrode pattern comprises electrical connector lines extending over the top surface of the epitaxial layer structure, some of the connector lines extending from the angled sides of the isosceles trapezoid structures and other ones of the connector lines extending from the upper bases of the isosceles trapezoid structures to spread current over the top surface of the epitaxial layer structure,
whereby, when the solar cell is generating current, current flows between each lead soldering region and the angled sides and upper base of its associated trapezoidal structure in the primary electrode pattern, and is spread over the top surface of the epitaxial layer structure by the secondary electrode pattern.

2. The solar cell according to claim 1, wherein a length of each upper base is substantially equal to a width of the lead soldering region, and wherein a length of each lower base is substantially equal to a spacing between adjacent lead soldering regions.

3. The solar cell according to claim 1, wherein the connector lines in the secondary electrode pattern have substantially uniform spacing.

4. The solar cell according to claim 1, wherein the isosceles trapezoidal structures of the primary electrode pattern are formed around a perimeter of the top surface of the epitaxial layer structure.

5. The solar cell according to claim 1, wherein the isosceles trapezoidal structures of the primary electrode pattern are formed along opposite edges of the top surface of the epitaxial layer structure.

6. The solar cell according to claim 1, wherein a length of each upper base is 0.1~2 mm, a length of each lower-base is 2~5 mm, and a distance between the upper base and lower base of each isosceles trapezoid structure is 0.1~1 mm.

7. The solar cell according to claim 1, wherein: the upper patterned electrode comprises:
an ohmic contact layer covering the epitaxial layer structure;
an adhesion layer covering the ohmic contact layer;
a conductive layer covering the adhesion layer; and
a protective layer covering the conductive layer.

8. The solar cell according to claim 7, wherein the ohmic contact layer has a thickness of 10~300 nm, and comprises at least one of an AuGe alloy, germanium, palladium, or combinations thereof.

9. The solar cell according to claim 8, wherein the adhesion layer has a thickness of 1~20 nm, and comprises one of titanium or nickel.

10. The solar cell according to claim 8, wherein the conductive layer has a thickness of 1~10 microns, and comprises a high-conductivity materials.

11. The solar cell according to claim 8, wherein the protective layer has a thickness of 10~200 nm, and comprises gold.

12. The solar cell according to claim 1, wherein the upper patterned electrode and an exposed surface of the epitaxial layer structure are covered with an antireflective film.

13. The solar cell according to claim 1, wherein each trapezoidal structure comprises a metal layer having the angled sides and upper base, and the lead soldering region for each trapezoidal structure is formed over the metal layer.

14. The solar cell according to claim 13, wherein current though each lead soldering region is coupled to the angled sides and upper base of its associated trapezoidal structure to a plurality of the connector lines.

15. The solar cell according to claim 14 wherein the angled sides spread current to a plurality of the connector lines.

* * * * *